United States Patent
Moon et al.

(10) Patent No.: US 12,087,840 B2
(45) Date of Patent: Sep. 10, 2024

(54) SEMICONDUCTOR DEVICE AND CAPACITOR INCLUDING HYDROGEN-INCORPORATED OXIDE LAYER

(71) Applicant: Samsung Electronics Co., Ltd., Suwon-si (KR)

(72) Inventors: Taehwan Moon, Suwon-si (KR); Keunwook Shin, Yongin-si (KR); Jinseong Heo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/173,604

(22) Filed: Feb. 11, 2021

(65) Prior Publication Data

US 2021/0296465 A1    Sep. 23, 2021

(30) Foreign Application Priority Data

Mar. 18, 2020    (KR) ........................ 10-2020-0033311

(51) Int. Cl.
*H01L 29/51*    (2006.01)
*H01L 29/06*    (2006.01)
*H01L 29/08*    (2006.01)

(52) U.S. Cl.
CPC ........ *H01L 29/517* (2013.01); *H01L 29/0638* (2013.01); *H01L 29/0847* (2013.01); *H01L 29/516* (2013.01)

(58) Field of Classification Search
CPC ............... H01L 29/517; H01L 29/0638; H01L 29/0847; H01L 29/516; H01L 28/40; H01L 29/40111; H01L 21/02318; H01L 21/02321; H01L 21/0234; H01L 21/02356; H01L 29/78; H01L 29/78391; H01L 21/02172; H10B 51/30; H10B 53/30; H10B 12/31; H10B 12/30
See application file for complete search history.

(56) References Cited

U.S. PATENT DOCUMENTS

| | | | |
|---|---|---|---|
| 8,012,818 B2 | 9/2011 | Roedle et al. | |
| 2003/0234417 A1 | 12/2003 | Raaijmakers et al. | |
| 2008/0166890 A1 | 7/2008 | Hwang | |
| 2009/0194797 A1* | 8/2009 | Shimizu | H01L 21/318 |
| | | | 257/288 |

(Continued)

FOREIGN PATENT DOCUMENTS

| | | |
|---|---|---|
| JP | 2010-502031 A | 1/2010 |
| KR | 10-2006-0098864 A | 9/2006 |
| KR | 10-2017-0112254 A | 10/2017 |

OTHER PUBLICATIONS

Polakowski et al, "Ferroelectricity in undoped hafnium oxide," Appl. Phys. Lett. 106, 232905 (2015) (Year: 2015).*

(Continued)

*Primary Examiner* — Julia Slutsker
(74) *Attorney, Agent, or Firm* — Harness, Dickey & Pierce, P.L.C.

(57) ABSTRACT

Disclosed are a semiconductor device and a capacitor which have relatively less leakage current. The semiconductor device includes a semiconductor layer, an oxide layer disposed on the semiconductor layer, and a metal layer disposed on the oxide layer, and a hydrogen concentration in the oxide layer is about 0.7 at % or more.

16 Claims, 12 Drawing Sheets

(56) References Cited

U.S. PATENT DOCUMENTS

| | | | |
|---|---|---|---|
| 2013/0019945 | A1 | 1/2013 | Hekmatshoar-Tabari et al. |
| 2018/0366547 | A1* | 12/2018 | Liu .................... H01L 29/1062 |
| 2019/0081131 | A1* | 3/2019 | Tokuhara .......... H01L 27/14692 |
| 2019/0103277 | A1* | 4/2019 | Luan ................. H01L 29/66795 |
| 2020/0328220 | A1* | 10/2020 | Derner ................ H01L 29/7827 |
| 2021/0057455 | A1* | 2/2021 | Nishida ................ H01L 21/022 |
| 2021/0226063 | A1* | 7/2021 | Yamazaki ........... H01L 29/7869 |

OTHER PUBLICATIONS

Dezelah et al. "The atomic layer deposition of HfO2 and ZrO2 using advanced metallocene precursors and H2O as the oxygen source," Chemical Vapor Deposition, 2008, 14, pp. 358-365. (Year: 2008).*

Blaschke et al., "A correlation study of layer growth rate, thickness uniformity, stoichiometry, and hydrogen impurity level in HfO2 thin films grown by ALD between 100° C. and 350° C.," Applied Surface Science, vol. 506, Mar. 15, 2020, 144188. (Year: 2020).*

Pal et al., "Enhancing ferroelectricity in dopant-free hafnium oxide," Appl. Phys. Lett. 110, 022903 ; 2017 (Year: 2017).*

Liao et al., "Grain Size Engineering of Ferroelectric Zr-doped HfO2 for the Highly Scaled Devices Applications," IEEE Electron Device Letters, vol. 40, No. 11, Nov. 2019 (Year: 2019).*

Muller et al., "Ferroelectric Hafnium Oxide A Game Changer to FRAM?," IEEE, 2014 14th Annual Non-Volatile Memory Technology Symposium (NVMTS), Oct. 27-29, 2014 (Year: 2014).*

Mittmann et al., "Optimizing process conditions for improved Hf1-xZrxO2 ferroelectric capacitor performance," Microelectronic Engineering 178 (2017), pp. 48-51 (Year: 2017).*

Chen et al., "Non-Volatile Ferroelectric FETs Using 5-nm Hf0.5Zr0.5O2 With High Data Retention and Read Endurance for 1T Memory Applications," IEEE Electron Device Letters, vol. 40, No. 3, Mar. 2019 (Year: 2019).*

Driemeier et al., "Interaction of HfO2/SiO2/Si structures with deuterium gas," Applied Physics Letters 88, 041918 (2006) (Year: 2006).*

Kozodaev et al, "Mitigating wakeup effect and improving endurance of ferroelectric HfO2—ZrO2 thin films by careful La-doping," J. Appl. Phys. 125, 034101 (2019) (Year: 2019).*

Hironori Yoshioka, et al., "Reduction of interface states by hydrogen treatment at the aluminum oxide/4H—SiC Si-face interface," AIP Advances 6, 105206 (2016), published Oct. 18, 2016.

Extended European Search Report issued Aug. 2, 2021 in Europe Application No. 21160448.3.

* cited by examiner

SEMICONDUCTOR DEVICE AND CAPACITOR INCLUDING HYDROGEN-INCORPORATED OXIDE LAYER

CROSS-REFERENCE TO RELATED APPLICATION

This application claims the benefit of Korean Patent Application No. 10-2020-0033311, filed on Mar. 18, 2020, in the Korean Intellectual Property Office, the disclosure of which is incorporated herein in its entirety by reference.

BACKGROUND

1. Field

The disclosure relates to semiconductor devices and capacitors, and more particularly, to semiconductor devices and capacitors which include a hydrogen-incorporated oxide layer.

2. Description of Related Art

Metal-oxide-semiconductor field effect transistors (MOSFET) are operated by transmitting an electric field of a gate to a channel via a gate oxide layer. However, as the thickness of a gate oxide layer decreases due to higher integration demands and the-thinning of semiconductor devices, the potential for leakage current increases and various problems may be generated due to the leakage current. The leakage current is closely related to the concentration of traps in an oxide layer, and oxygen vacancy in the oxide layer is a typical trap.

Heat treatment may be performed in an oxygen-containing atmosphere to reduce the leakage current by removing the oxygen vacancies. For example, leakage current characteristics may be improved by removing the oxygen vacancy through oxygen heat treatment. However, the thickness of an interfacial layer for restricting the formation of an interface trap between an oxide layer and a silicon substrate may be increased due to oxygen heat treatment. As the interfacial layer including a silicon oxide has a relatively low permittivity, the overall electrostatic capacity of a metal-oxide-semiconductor field effect transistor may be degraded as the thickness of an interfacial layer increases.

SUMMARY

Provided are semiconductor devices and capacitors which have a relatively less leakage current.

Furthermore, provided are semiconductor devices and capacitors which have no degradation of thin electrostatic capacity because a thin thickness of an interfacial layer is maintained, and a method of fabricating the semiconductor devices and capacitors.

In particular, provided are semiconductor devices and capacitors which include a hydrogen-incorporated oxide layer including a concentration of hydrogen at 0.7 at % or more.

Additional aspects will be set forth in part in the description which follows and, in part, will be apparent from the description, or may be learned by practice of the presented embodiments of the disclosure.

According to an embodiment, an electronic device includes an oxide layer including a concentration of hydrogen at 0.7 at % or more, and a first conductive layer on the oxide layer.

The first conductive layer may include, for example, at least one of Ti, TIN, TiAlN, TiAl, Ta, TaN W, WN, Mo, Ru, RuO, Pt, and Ni The oxide layer may include, for example, a ferroelectric material.

The oxide layer may have a crystalline structure.

For example, the oxide layer may include at least one material selected from among $HfO_2$, $ZrO_2$, and $Hf_xZr_{1-x}O_2$ ($0<x<1$).

Furthermore, the oxide layer may further include at least one dopant selected from among Al, La, Y, Si, Sr, Gd, and Ge.

The concentration of hydrogen in the oxide layer may be about 10 at % or less.

For example, the concentration of hydrogen in the oxide layer may be about 1 at % to about 5 at %.

The electronic device may include a semiconductor layer under the oxide layer. The semiconductor layer may include a semiconductor substrate doped with a first conductive type impurity, and a source region and a drain region in an upper area of the semiconductor substrate and doped with a second conductive type impurity that is electrically opposite to the first conductive type impurity.

The oxide layer may be on an upper surface of the semiconductor substrate between the source region and the drain region.

The semiconductor device may further include an interfacial layer between the semiconductor substrate and the oxide layer.

The interfacial layer may include an oxide of a semiconductor material of the semiconductor substrate.

The concentration of hydrogen in the interfacial layer may be greater than the concentration of hydrogen in the oxide layer, and the concentration of hydrogen in the oxide layer may be greater than a concentration of hydrogen in the semiconductor layer The electronic device may further include a source electrode disposed on the source region and a drain electrode disposed on the drain region.

Furthermore, according to another example embodiment, an electronic device may include, in addition to the first conductive layer and the oxide layer on the first conductive layer, a second conductive layer on the oxide layer.

The second conductive layer may include at least one metal material selected from among Ti, TIN, TiAlN, TiAl, Ta, TaN W, WN, Mo, Ru, RuO, Pt, and Ni.

Furthermore, according to another embodiment, a memory device includes a semiconductor device having the above-described structure and a capacitor having the above-described structure.

Furthermore, according to another example embodiment, a method of fabricating an electronic device may including forming an oxide layer on a substrate; performing a heat treatment on the oxide layer to crystallize the oxide layer; and performing a hydrogen treatment on the oxide layer to distribute hydrogen into the crystallized oxide layer to a concentration of 0.7 at % or more.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
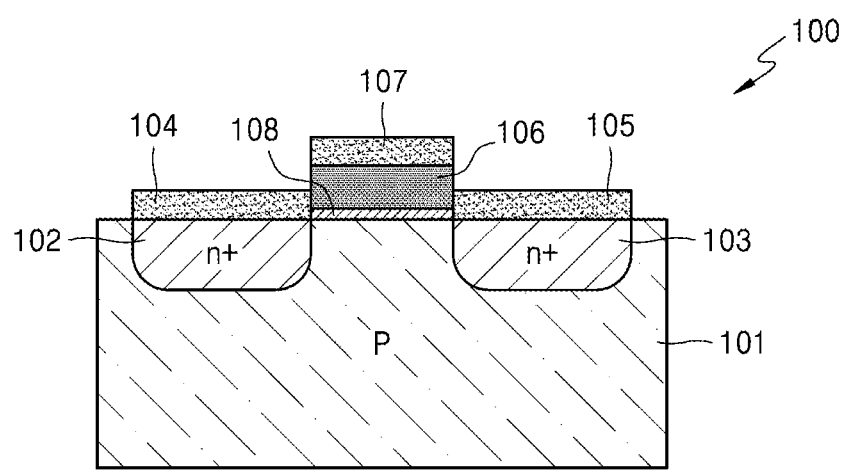
FIG. 1 is a schematic cross-sectional view of a configuration of a semiconductor device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, semiconductor devices and capacitors including a hydrogen-incorporated oxide layer are described below in detail with reference to the accompanying drawings. In the accompanying drawings, like reference numerals refer to like elements throughout. The thickness or size of each layer illustrated in the drawings may be exaggerated for convenience of explanation and clarity. Furthermore, as embodiments described below are example embodiments, other modifications may be produced from the example embodiments.

In a layer structure, when a constituent element is disposed "above" or "on" to another constituent element, the constituent element may be only directly on the other constituent element or above the other constituent elements in a non-contact manner. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Also, the steps of all methods described herein can be performed in any suitable order unless otherwise indicated herein or otherwise clearly contradicted by context. The disclosure is not limited to the described order of the steps.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes.

Furthermore, the connecting lines, or connectors shown in the various figures presented are intended to represent functional relationships and/or physical or logical couplings between the various elements. It should be noted that many alternative or additional functional relationships, physical connections, and/or logical connections may be present in a practical device.

The use of any and all examples, or language (e.g., "such as") provided herein, is intended merely to better illuminate the disclosure and does not pose a limitation on the scope of the disclosure unless otherwise claimed.

FIG. 1 is a schematic cross-sectional view of a configuration of a semiconductor device 100 according to an example embodiment. Referring to FIG. 1, the semiconductor device 100 according to an embodiment may include semiconductor substrate 101, an oxide layer 106 on the semiconductor substrate 101, and conductive layers 104, 105, and 107 on the semiconductor substrate 101, and the oxide layer 106.

The semiconductor substrate 101 may include, for example, a semiconductor doped with a first conductive type impurity and a source region 102 and a drain region 103 including a semiconductor doped with a second conductive type impurity that is electrically opposite to the first conductive type impurity. Although FIG. 1 illustrates that the semiconductor substrate 101 is doped with a p type impurity and the source region 102 and the drain region 103 are doped with an n+ type impurity, this is merely an example, and the disclosure is not limited thereto. For example, the semiconductor substrate 101 may be doped with an n type impurity, and the source region 102 and the drain region 103 may be doped with a p+ type impurity.

The semiconductor substrate 101, the source region 102, and the drain region 103 may include the same semiconductor material. For example, when the semiconductor substrate 101 is of a p type and the source region 102 and the drain region 103 are of an n+ type, after the semiconductor substrate 101 is doped with a p type impurity, a mask is patterned on an upper surface of the semiconductor substrate 101, and an upper area of the semiconductor substrate 101 is doped with an n+ type impurity, and thus the source region 102 and the drain region 103 may be formed. The amount of impurities acting as dopants in the source region 102 and the drain region 103 may be greater than the amount of impurities acting as dopants in remainder of the semiconductor substrate 101

The semiconductor material of the semiconductor substrate 101, the source region 102, and the drain region 103 may include, for example, at least one of silicon (Si) and/or germanium (Ge), but the disclosure is not necessarily limited thereto. Various semiconductor materials may be used in addition to silicon and germanium. For example, the semiconductor material of the semiconductor substrate 101, the source region 102, and the drain region 103 may include Group III-V compound semiconductors, Group II-VI compound semiconductors, oxide semiconductors, organic material semiconductors, quantum dots, or two dimensional crystal semiconductors. The Group III-V compound semiconductors may include, for example, at least one of GaN, GaP, GaAs, GaSb, InP, InAs, InSb, InGaAs, and InGaN. The Group II-VI compound semiconductors may include, for example, at least one of ZnS, CdS, ZnSe, CdSe, ZnTe, and CdTe. Furthermore, the oxide semiconductor may include, for example, at least one of silicon indium zinc oxide (SIZO), silicon zinc tin oxide (SZTO), indium gallium zinc oxide (IGZO), indium zinc oxide (IZO), zinc tin oxide (ZTO), $CuAlO_2$, $CuG_2O_2$, $SrCu_2O_2$, and $SnO_2$. The two-dimensional crystal semiconductor may include, for example, a transition metal dichalcogenide comprising a transition metal and a chalcogen element.

The oxide layer 106 may be on the upper surface of the semiconductor substrate 101 between the source region 102 and the drain region 103. The oxide layer 106 may include a ferroelectric material having a high permittivity. The oxide layer 106 may have a crystalline structure. For example, the oxide layer 106 may include crystals of a ferroelectric material having a dielectric constant of 10 or more. As the oxide layer 106 has a high dielectric constant of 10 or more, the semiconductor device 100 may have a large electrostatic capacity. The oxide layer 106 may include, for example, $HfO_2$, $ZrO_2$, and $Hf_xZr_{1-x}O_2$ ($0<x<1$). Furthermore, in order to further increase a dielectric constant of the oxide layer 106, the oxide layer 106 may be doped with at least one dopant selected from among Al, La, Y, Si, Sr, Gd, and Ge.

The conductive layers 104, 105, and 107 may include a source electrode 104 on the source region 102 and electrically connected to the source region 102, a drain electrode 105 on the drain region 103 and electrically connected to the drain region 103, and a gate electrode 107 on the oxide layer 106. The conductive layers 104, 105, and 107 may include a conductive material and/or metal, for example, at least one of Ti, TIN, TiAlN, TiAl, Ta, TaN W, WN, Mo, Ru, RuO, Pt, Ni, or combination thereof.

In the semiconductor device 100 configured as above, the oxide layer 106 may electrically insulate the gate electrode 107 from the substrate 101 and, thus, prevent and/or suppress the leakage of current from the gate electrode 107 toward the semiconductor substrate 101. The gate electrode 107 may apply an electric field to the semiconductor substrate 101 between the source region 102 and the drain region 103. When an electric filed is applied to the semiconductor substrate 101 by the gate electrode 107, a current may flow between the source region 102 and the drain region 103 via the semiconductor substrate 101, and the semiconductor device 100 may be considered in an on-state. Accordingly, the semiconductor substrate 101 may serve as a channel between the source region 102 and the drain region 103. For example, the semiconductor device 100 may be a metal-oxide-semiconductor field effect transistor (MOSFET).

Furthermore, the semiconductor device 100 may further include an interfacial layer 108 between the semiconductor substrate 101 and the oxide layer 106. The interfacial layer 108 may reduce a leakage current by restricting formation of an interface trap between the semiconductor substrate 101 and the oxide layer 106. The interfacial layer 108 may include an oxide of the semiconductor material of the semiconductor substrate 101. For example, when the semiconductor substrate 101 includes silicon, the interfacial layer 108 may include silicon oxide ($SiO_2$). As the material of the interfacial layer 108 typically has a low dielectric constant of 4 or less, the interfacial layer 108 may be formed to have a thin thickness so as not to degrade the electrostatic capacity of the semiconductor device 100. For example, the thickness of the interfacial layer 108 may be less than 1 nm.

According to the present example embodiment, in order to prevent an increase of a leakage current even when the thickness of the oxide layer 106 decreases according to ultra-thinning of the semiconductor device 100 having the above structure, hydrogen may be intentionally injected into the oxide layer 106 through a hydrogen treatment. Accordingly, in the semiconductor device 100 according to the present embodiment, the oxide layer 106 may include about an atomic percentage (at %) of hydrogen at 0.7 at % or more.

Figure 2:
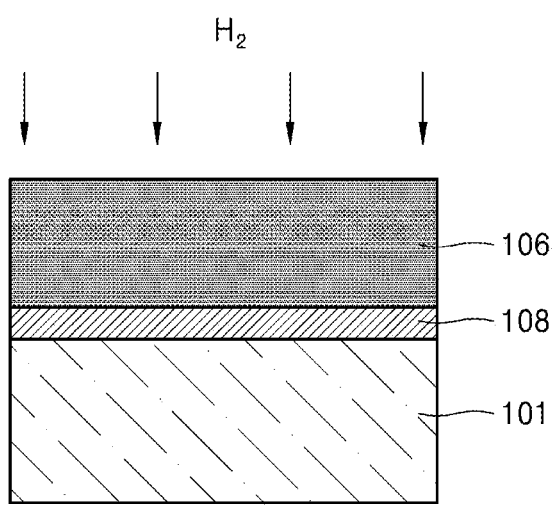
FIG. 2 schematically illustrates a hydrogen treatment performed on an oxide layer after forming the oxide layer.

For example, FIG. 2 schematically illustrates a hydrogen treatment performed on the oxide layer 106 after forming the oxide layer 106. After the oxide layer 106 is deposited on the upper surface of the semiconductor substrate 101 or an upper surface of the interfacial layer 108, the oxide layer 106 may be crystallized through a heat treatment. Then, monatomic hydrogen may be distributed in the oxide layer 106 by performing a hydrogen plasma treatment ($H_2$ plasma) or a high-temperature heat treatment, for example, forming gas annealing, in a hydrogen atmosphere. After the hydrogen treatment on the oxide layer 106 is completed, the source electrode 104, the drain electrode 105, and the gate electrode 107 may be formed on the semiconductor substrate 101, for example, through metal material deposition, heat treatment, and patterning.

Figure 3:
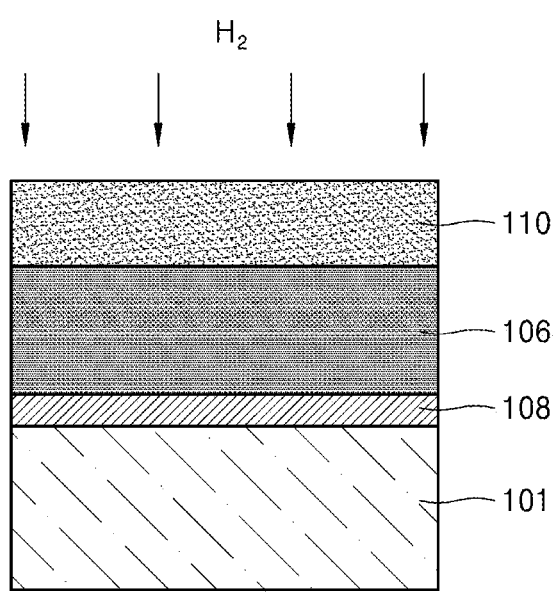
FIG. 3 schematically illustrates a hydrogen treatment performed on an oxide layer after depositing a metal material.

FIG. 2 illustrates that the oxide layer 106 undergoes the hydrogen treatment before the deposition of the metal material, but the disclosure is not necessarily limited thereto. For example, FIG. 3 schematically illustrates a hydrogen treatment performed on the oxide layer 106 after forming a metal material 110. Referring to FIG. 3, after the oxide layer 106 is deposited on the upper surface of the semiconductor substrate 101 or the upper surface of the interfacial layer 108, the oxide layer 106 is crystallized through the heat treatment. Then, a metal material 110 may be deposited on the oxide layer 106 and then may undergo a heat treatment. Although FIG. 3 illustrates, for convenience, only the metal material 110 deposited on the oxide layer 106, the metal material 110 may also be formed even on the source region 102 and the drain region 103.

Then, monatomic hydrogen may be distributed in the oxide layer 106 by performing a hydrogen plasma treatment or a high-temperature heat treatment in a hydrogen atmosphere on a structure including the metal material 110. In the hydrogen treatment, hydrogen atoms may be distributed in the oxide layer 106 by passing through the metal material 110. As the hydrogen atom is very small and the thickness of the metal material 110 is very thin, the hydrogen atoms may pass through the metal material 110 and arrive at the oxide layer 106. The metal material 110 may also protect the upper surface of the oxide layer 106 and the substrate 101 during the hydrogen treatment, for example by diffusing the energy from the hydrogen plasma more evenly across the upper surface of the oxide layer 106 and the substrate 101. After the hydrogen treatment is completed, the source electrode 104, the drain electrode 105, and the gate electrode 107 may be formed by patterning the metal material 110.

Figure 4:
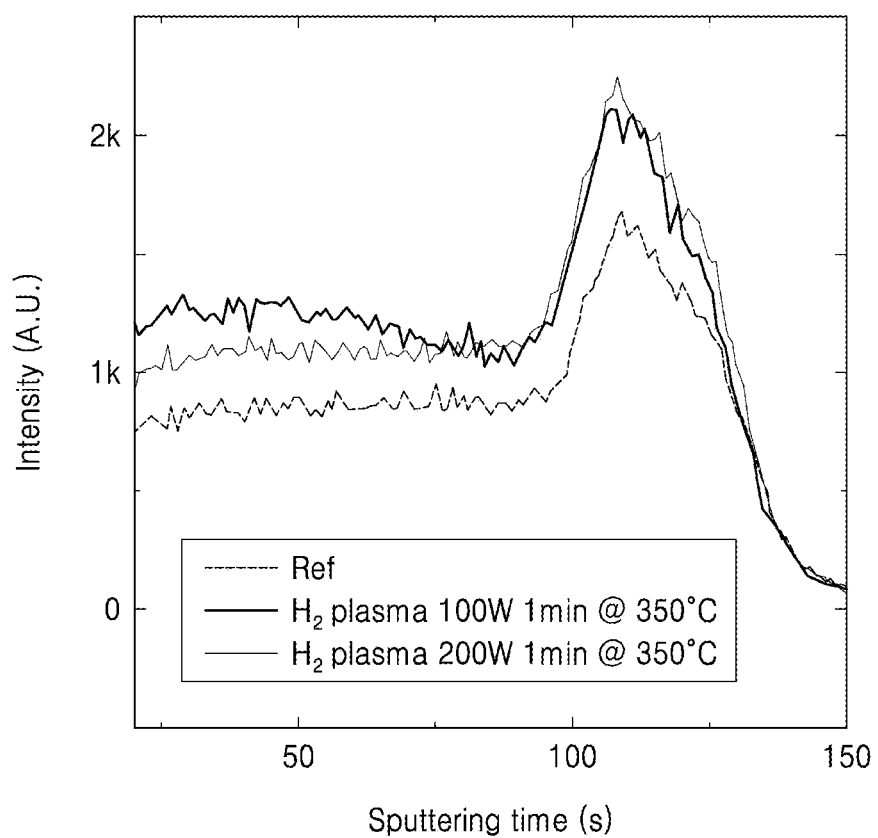
FIG. 4 is a graph of a change in the hydrogen concentration in an oxide layer, an interfacial layer, and a semiconductor layer after hydrogen treatment.

FIG. 4 is a graph of a change in the hydrogen concentration in the oxide layer 106, the interfacial layer 108, and the semiconductor substrate 101 after the hydrogen treatment. In FIG. 4, the graph indicated by the thick solid line shows a change in the hydrogen concentration with respect to a sample that underwent a hydrogen plasma treatment in a plasma-enhanced chemical vapor deposition (PECVD) chamber with an output of a radio frequency (RF) plasma generator of 100 W for one minute at a temperature of 350° C., the graph indicated by the thin solid line shows a change in the hydrogen concentration with respect to a sample that underwent a hydrogen plasma treatment in the PECVD chamber with an output of the RF plasma generator of 200 W for one minute at a temperature of 350° C., and the graph indicated by a dotted line shows a change in the hydrogen concentration with respect to a sample that does not undergo the hydrogen treatment.

The graph of FIG. 4 shows a result of a measurement of the amount of elements in the chamber using a secondary ion mass spectroscopy (SIMS) method by sequentially cutting off the interfacial layer 108 and the semiconductor substrate 101 from the upper surface of the oxide layer 106 through sputtering. At the initial stage of the sputtering, the elements constituting the oxide layer 106 are measured, and then the elements constituting the interfacial layer 108 and the semiconductor substrate 101 are measured. As illustrated in FIG. 4, the amount of hydrogen elements is the greatest in the oxide layer 106 of the sample that underwent the hydrogen plasma treatment with the output of the RF plasma generator of 100 W, whereas the amount of hydrogen elements in the oxide layer 106 of the sample that does not undergo a hydrogen treatment is the least. Furthermore, the amount of hydrogen elements in the oxide layer 106 is maintained relatively uniform without being changed much depending on the depth. The amount of hydrogen elements increases in the interfacial layer 108 and decreases in the semiconductor substrate 101. In particular, when the depth of the semiconductor substrate 101 increases, the amounts of hydrogen elements of the sample that underwent the hydrogen treatment and the sample that does not undergo the hydrogen treatment are almost the same.

Figure 5:
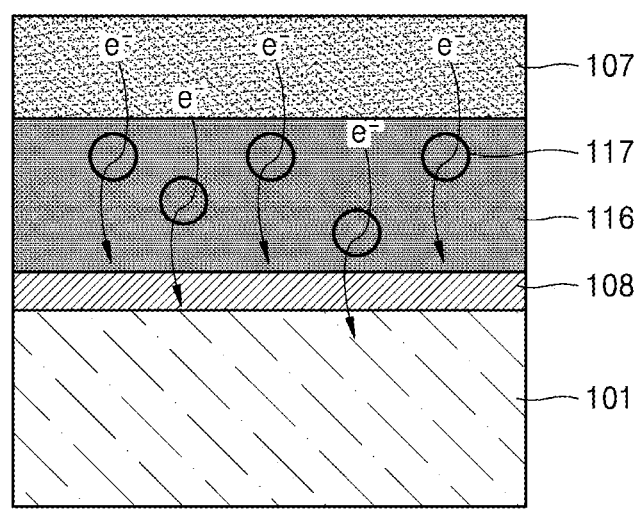
FIG. 5 is a schematic view showing a cause for the generation of a leakage current in a comparative example.
Figure 6:
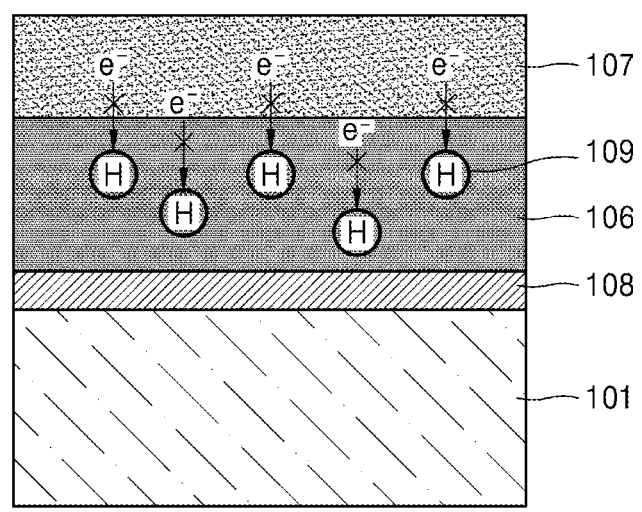
FIG. 6 is a schematic view showing a cause for a decrease of a leakage current in an example embodiment.

FIG. 5 is a schematic view showing a cause for the generation of a leakage current in a comparative example, and FIG. 6 is a schematic view showing a cause for a decrease of a leakage current in an example embodiment. Referring to FIG. 5, a plurality of oxygen vacancies 117 may exist in an oxide layer 116 that does not undergo the hydrogen treatment. As an electrical field is applied from the gate electrode 107 are electrons may migrate from the gate electrode 107 to the oxide layer 116 and become trapped by the oxygen vacancies 117. In contrast, referring to FIG. 6, in the oxide layer 106 that underwent the hydrogen treatment, monatomic hydrogen in the oxide layer 106 passivates the plurality of oxygen vacancies. As oxygen vacancies 109 that are passivated by hydrogen do not function as charge traps, the monatomic hydrogen may help prevent and/or suppress electrons in the gate electrode 107 from moving to the semiconductor substrate 101 via the oxide layer 106.

Figure 7:
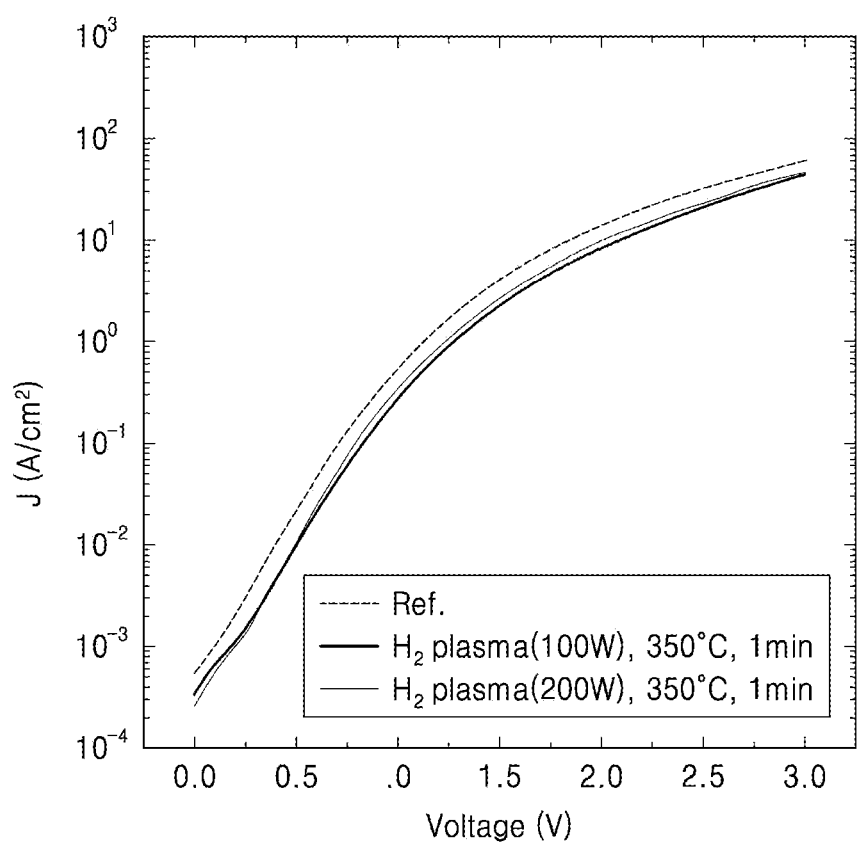
FIG. 7 is a graph showing a comparison of a leakage current between a comparative example and an example embodiment.
Figure 8:
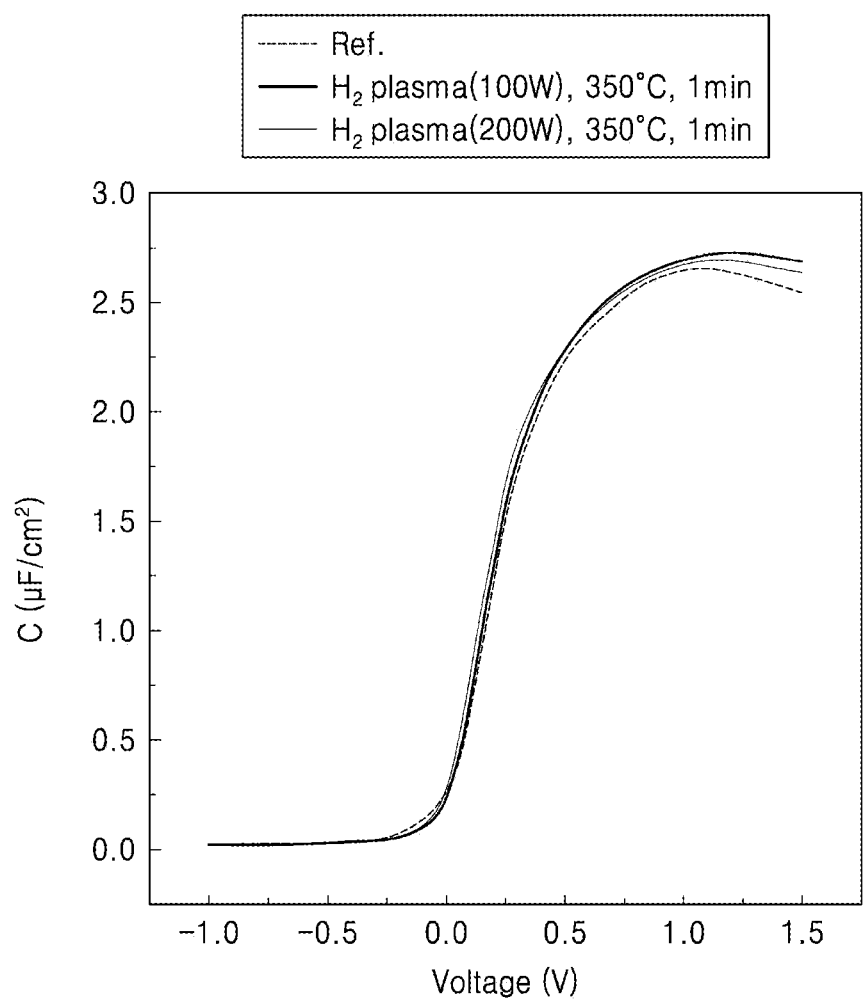
FIG. 8 is a graph showing a comparison of electrostatic capacity between a comparative example and an example embodiment.

FIG. 7 is a graph showing a comparison of a leakage current between a comparative example and an example embodiment. FIG. 8 is a graph showing a comparison of electrostatic capacity between a comparative example and an example embodiment. The comparative example and the embodiment each may include a p-type silicon substrate, a SiO$_2$ interfacial layer having a 0.7 nm thickness, a Hf$_{0.5}$Zr$_{0.5}$O$_2$ oxide layer having a 1.5 nm thickness, and a Mo gate electrode having a 120 nm thickness. While no hydrogen treatment is performed on a sample according to the comparative example, the hydrogen treatment is performed on a sample according to an example embodiment. In FIGS. 7 and 8, a graph indicated by a thick solid line denotes an example embodiment in which a hydrogen plasma treatment was performed in the PECVD chamber with an output of the RF plasma generator of 100 W for one minute at a temperature of 350° C., a graph indicated by a thin solid line denotes an example embodiment in which a hydrogen plasma treatment was performed in the PECVD chamber with an output of the RF plasma generator of 200 W for one minute at a temperature of 350° C., and a graph indicated by a dotted line denotes a comparative example in which no hydrogen treatment is performed.

Referring to FIG. 7, a leakage current in the comparative example is the greatest, a leakage current in the example embodiment in which a hydrogen plasma treatment is performed with an output of 200 W is less than the leakage current of the comparative example, and the leakage current is the least in the example embodiment in which a hydrogen plasma treatment is performed with an output of 100 W. Furthermore, referring to FIG. 8, electrostatic capacity is the least in the comparative example, the electrostatic capacity in the embodiment in which a hydrogen plasma treatment is performed with an output of 200 W is greater than the electrostatic capacity of the comparative example, and the electrostatic capacity is the greatest in the embodiment in which a hydrogen plasma treatment is performed with an output of 100 W.

As described above, as hydrogen is intentionally injected into the oxide layer 106 in the semiconductor device 100, the oxide layer 106 in the semiconductor device 100 may contain about 0.7 at % or more of hydrogen. The hydrogen in the oxide layer 106 passivates oxygen vacancies so that the movement of electrons through the oxide layer 106 may be prevented and/or suppressed. Accordingly, the leakage current of the oxide layer 106 in the semiconductor device 100 may be reduced and/or prevented. Furthermore, as an oxygen heat treatment is not performed, an increase in the thickness of the interfacial layer 108 may be prevented so that the electrostatic capacity of the semiconductor device 100 is not degraded.

For example, according to the quantitative analysis of a hydrogen concentration in the oxide layer 106 checked through a high-resolution elastic recoil detection analysis (HR-ERDA), the hydrogen concentration in the oxide layer 106 may be about 0.7 at % or more. However, referring to the graphs of FIGS. 3, 7, and 8, it is not that, as the hydrogen concentration in the oxide layer 106 increases, a leakage current necessarily further decreases. Rather, when the hydrogen concentration in the oxide layer 106 increases beyond a threshold, the leakage current rather increases. For example, the hydrogen concentration in the oxide layer 106 may be about 10 at % or less. In particular, the hydrogen concentration in the oxide layer 106 may have a within range of about 0.7 at % to about 10 at %, for example, between about 1 at % to about 5 at %.

Figure 9:
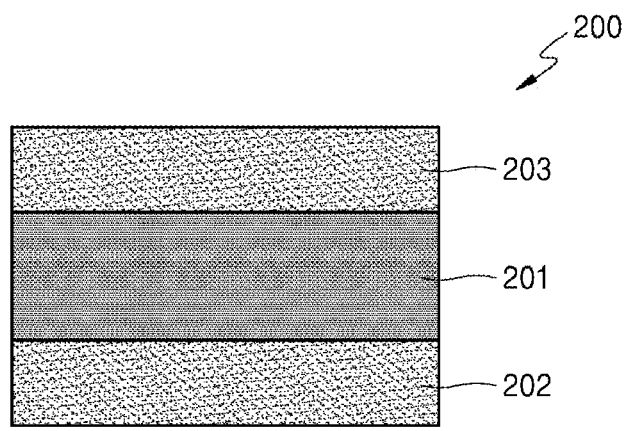
FIG. 9 is a schematic cross-sectional view of a configuration of a capacitor according to another example embodiment.

Although the hydrogen concentration in the oxide layer 106 of the semiconductor device 100 is described above, a detailed principle may be applied to a device including an oxide layer other than the semiconductor device 100. For example, FIG. 9 is a schematic cross-sectional view of a configuration of a capacitor 200 according to another embodiment. Referring to FIG. 9, the capacitor 200 may include a first conductive layer 202, an oxide layer 201 on the first conductive layer 202, and a second conductive layer 203 on the oxide layer 201.

The first conductive layer 202 and the second conductive layer 203 each may include, for example, a conductive material and/or metal material. The example the conductive material and/or metal material may include at least one of Ti, TiN, TiAlN, TiAl, Ta, TaN W, WN, Mo, Ru, RuO, Pt, Ni, and a combination thereof. The first conductive layer 202 and the second conductive layer 203 may include the same material or different materials from each other.

The oxide layer 201 may include the same material as the oxide layer 106 of the semiconductor device 100. For example, the oxide layer 201 of the capacitor 200 may include a ferroelectric material having a high permittivity and may have a crystalline structure. The material of the oxide layer 201 may include, for example, $HfO_2$, $ZrO_2$, and $Hf_xZr_{1-x}O_2$ (0<x<1). Furthermore, the oxide layer 201 may be further doped with at least one of Al, La, Y, Si, Sr, Gd, and Ge.

Furthermore, to reduce the leakage current, the oxide layer 201 of the capacitor 200 may contain hydrogen within a range of concentrations. The electrostatic capacity of the capacitor 200 including the oxide layer 201 may be increased through the hydrogen treatment. For example, the hydrogen concentration in the oxide layer 201 may be about 0.7 at % or more. The hydrogen concentration in the oxide layer 201 may be about 10 at % or less. In particular, the concentration of hydrogen in the oxide layer 201 may be between about 0.7 at % and about 10 at %. For example, the hydrogen concentration in the oxide layer 201 may range from about 1 at % to about 5 at %.

Figure 10:
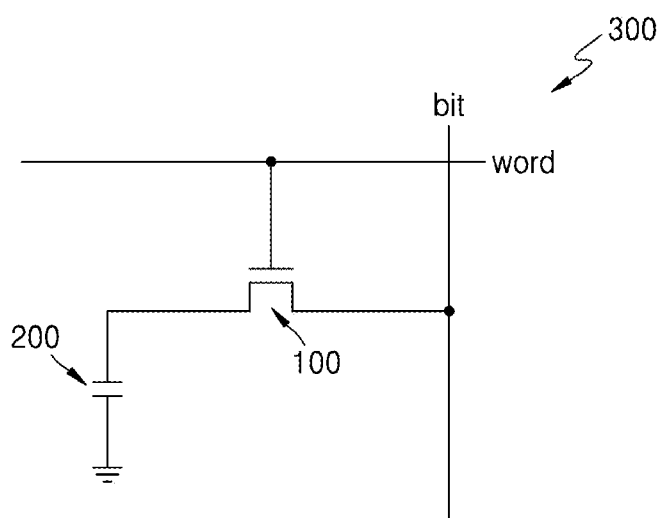
FIG. 10 illustrates a circuit configuration of a memory cell of a memory device including a semiconductor device and a capacitor.
Figure 11:
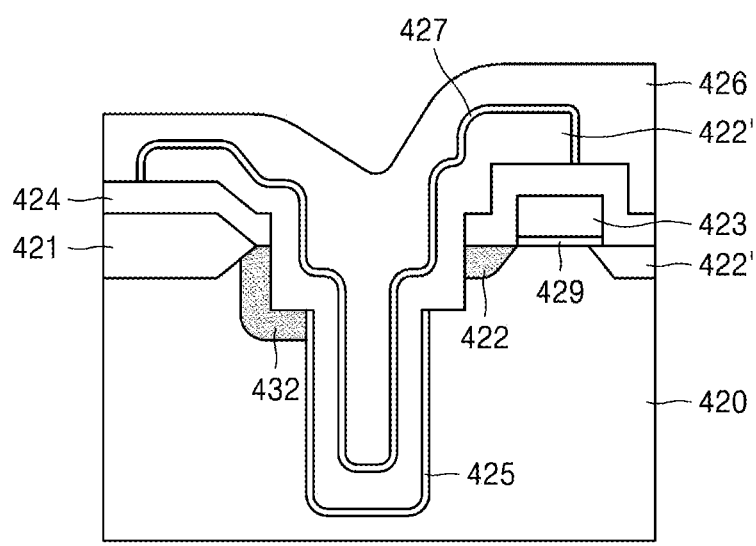
FIG. 11 illustrates a structure of a trench capacitor-type dynamic random access memory (DRAM)

The semiconductor device 100 and the capacitor 200 described above together may constitute a memory cell. For example, FIG. 10 illustrates a circuit configuration of a memory cell 300 of a memory device including the semiconductor device 100 and the capacitor 200. FIG. 11 illustrates an example embodiment of an integrated circuit design including the memory cell. Referring to FIG. 10, the memory cell 300 may include the semiconductor device 100 and the capacitor 200 electrically connected to the source electrode 104 of the semiconductor device 100. The memory device may include a plurality of bit lines and a plurality of word lines, and may further include a plurality of memory cells illustrated in FIG. 10. Each word line may be electrically connected to the gate electrode 107 of the semiconductor device 100, and each bit line may be electrically connected to the drain electrode 105 of the semiconductor device 100. The first conductive layer 202 of the capacitor 200 may be electrically connected to the source electrode 104 of the semiconductor device 100, and the second conductive layer 203 of the capacitor 200 may be grounded. The memory device including the memory cell 300 may have a low consumption power because the leakage of a current in the memory cell 300 is less.

FIG. 11 illustrates a structure of a trench capacitor-type dynamic random access memory (DRAM).

Referring to FIG. 11, on a semiconductor substrate 420, a device isolation region may be defined with a field oxide film 421, and a gate electrode 423 and source/drain impurity regions 422 and 422' may be formed in the device isolation region. A gate oxide layer 429 may be formed between the gate electrode 423 and the semiconductor substrate 420. An oxide film may be formed as an interlayer insulating film 424. A region not to be a trench may be capped with a trench buffer layer, and a part of the source region 422 may be open to form a contact portion.

A trench is formed in a sidewall of the interlayer insulating film 424, and a sidewall oxide film 425 may be formed over the entire sidewall of the trench. The sidewall oxide film 425 may compensate for damage in the semiconductor substrate caused by etching to form the trench, and may serve as a dielectric film between the semiconductor substrate 420 and a storage electrode 426. A sidewall portion of part of the source region 422, except for the other part of the source region near the gate electrode 423, may be entirely exposed.

A PN junction (not illustrated) may be formed in the sidewall portion of the source region by impurity implantation. The trench may be formed in the source region 422. A sidewall of the trench near the gate may directly contact the source region 422, and the PN junction may be formed by additional impurity implantation into the source region.

A storage electrode 426 may be formed on part of the interlayer insulating film 424, the exposed source region 422, and the surface of the sidewall oxide film 425 in the trench. The storage electrode 426 may be formed to contact the entire source region 422 in contact with the upper sidewall of the trench, in addition to the part of the source region 422 near the gate electrode 423. Next, an insulating film 427 as a capacity dielectric film may be formed along the upper surface of the storage electrode 426, and a polysilicon layer as a plate electrode 428 may be formed thereon, thereby completing a trench capacitor type DRAM. The gate electrode 429, the insulating film 427, and/or the interlayer insulating film 424, for example, may be an embodiment of the oxide layer including 0.7 at % or more of hydrogen.

The aforementioned electronic devices including an oxide layer containing hydrogen within a range of concentrations may be applied to various electronic circuit devices including a transistor, for example as part of processing circuitry and/or memory.

Figure 12:
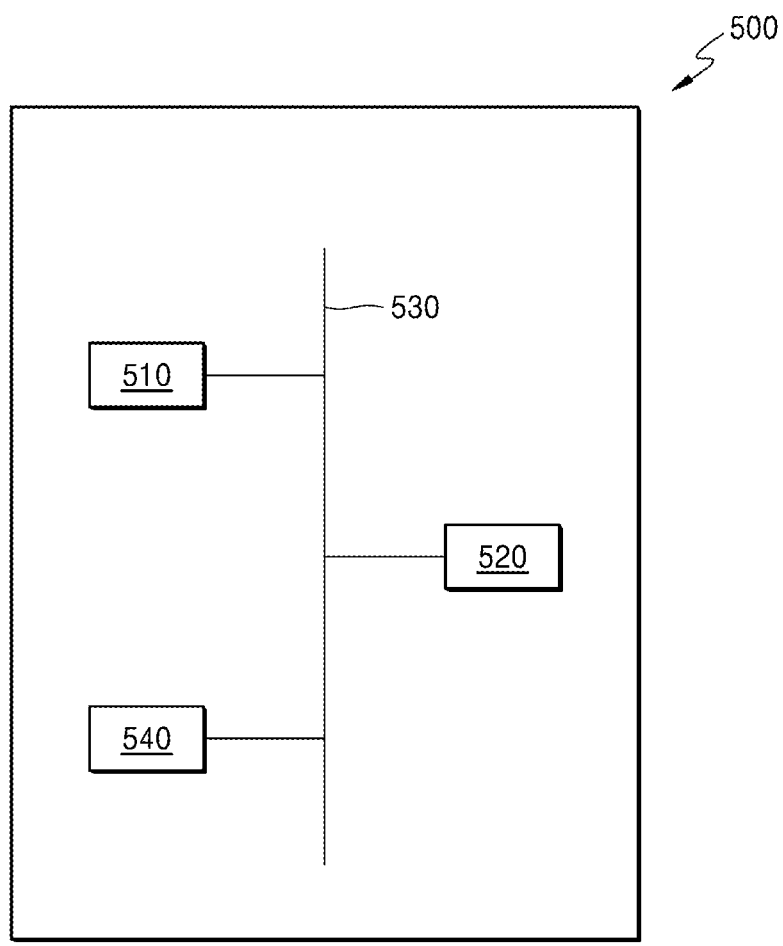
FIG. 12 shows a schematic of a circuit that may include the aforementioned electronic devices according to some example embodiments.

FIG. 12 shows a schematic of a circuit that may include the aforementioned electronic devices according to some example embodiments.

As shown, the electronic device 500 includes one or more electronic device components, including a processor (e.g., processing circuitry) 510 and a memory 520 that are communicatively coupled together via a bus 530.

The processing circuitry 510, may be included in, may include, and/or may be implemented by one or more instances of processing circuitry such as hardware including logic circuits, a hardware/software combination such as a processor executing software; or a combination thereof. For example, the processing circuitry 510 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 520 may include a non-transitory computer readable storage device, for example a solid state drive (SSD), storing a program of instructions, and the processing circuitry 600 may be configured to execute the program of instructions to implement the functionality of the electronic device 500.

In some example embodiments, the electronic device 500 may include one or more additional components 540, coupled to bus 530, which may include, for example, a power supply, a light sensor, a light-emitting device, any combination thereof, or the like. In some example embodiments, one or more of the processing circuitry 510, memory 520, and/or one or more additional components 540 may include any electronic device including electrodes and an oxide layer including 0.7 at % or more of hydrogen such that the one or more of the processing circuitry 510, memory 520, and/or one or more additional components 540, and thus, the electronic device 500, may include the semiconductor device 100 (refer to FIG. 1), the capacitor 200 (refer to FIG. 9), and/or the memory cell 300 (refer to FIG. 12).

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic device comprising:
a ferroelectric material layer, the ferroelectric material layer including an oxide with a concentration of hydrogen at about 0.7 at % or more, wherein at least a portion of the hydrogen is monatomic such that the monatomic hydrogen passivates oxygen vacancies in the oxide;
a first conductive layer on the ferroelectric material layer; and
an interfacial layer on an opposite side of the ferroelectric material layer compared to the first conductive layer,
wherein a concentration of hydrogen in the interfacial layer is greater than the concentration of hydrogen in the ferroelectric material layer, and
wherein the ferroelectric material layer comprises $Hf_xZr_{1-x}O_2$ (0<x<1) having a crystalline structure.

2. The electronic device of claim 1, wherein the first conductive layer comprises at least one of Ti, TiN, TiAlN, TiAl, Ta, TaN W, WN, Mo, Ru, RuO, Pt, and Ni.

3. The electronic device of claim 1, wherein the oxide included in the ferroelectric material layer comprises $Hf_{0.5}Zr_{0.5}O_2$.

4. The electronic device of claim 3, wherein the ferroelectric material layer further comprises at least one dopant selected from among Al, La, Y, Si, Sr, Gd, and Ge.

5. The electronic device of claim 1, wherein the concentration of hydrogen in the ferroelectric material layer is about 10 at % or less.

6. The electronic device of claim 5, wherein the concentration of hydrogen in the ferroelectric material layer is about 1 at % to about 5 at %.

7. The electronic device of claim 1, further comprising a semiconductor layer under the ferroelectric material layer.

8. The electronic device of claim 7, wherein the semiconductor layer comprises:
a semiconductor substrate doped with a first conductive type impurity; and
a source region and a drain region in an upper area of the semiconductor substrate, the source region and the drain region doped with a second conductive type impurity that is electrically opposite to the first conductive type impurity.

9. The electronic device of claim 8, wherein the ferroelectric material layer is on an upper surface of the semiconductor substrate between the source region and the drain region.

10. The electronic device of claim 9, wherein the interfacial layer is between the semiconductor substrate and the ferroelectric material layer.

11. The electronic device of claim 10, wherein the interfacial layer comprises an oxide of a semiconductor material of the semiconductor substrate.

12. The electronic device of claim 10, wherein
the concentration of hydrogen in the ferroelectric material layer is greater than a concentration of hydrogen in the semiconductor layer.

13. The electronic device of claim 8, further comprising:
a source electrode on the source region; and
a drain electrode on the drain region.

14. The electronic device of claim 13, wherein the electronic device is a transistor.

15. A memory device comprising:
a semiconductor device including
a semiconductor layer including a source region, and a drain region,
a gate oxide layer on the semiconductor layer, the gate oxide layer including a ferroelectric material, the ferroelectric material including an oxide with a concentration of 0.7 at % or more of hydrogen, wherein at least a portion of the hydrogen is monatomic such that the monatomic hydrogen passivates oxygen vacancies in the oxide,
an electrode on the gate oxide layer, and
an interfacial layer between the gate oxide layer and the semiconductor layer, wherein a concentration of hydrogen in the interfacial layer is greater than the concentration of hydrogen in the ferroelectric material; and
a capacitor including
a first conductive layer electrically connected to the source region of the semiconductor layer;
a dielectric oxide layer including about 0.7 at % or more of hydrogen on the first conductive layer; and
a second conductive layer on the dielectric oxide layer, and
wherein the ferroelectric material layer comprises $Hf_xZr_{1-x}O_2$ (0<x<1) having a crystalline structure.

16. The electronic device of claim 1, wherein an amount of the hydrogen in the ferroelectric layer is maintained substantially uniform depending on a depth of the ferroelectric layer, and an amount of the hydrogen increases in the interfacial layer.

* * * * *